United States Patent
Baukus et al.

(10) Patent No.: US 6,613,661 B1
(45) Date of Patent: Sep. 2, 2003

(54) PROCESS FOR FABRICATING SECURE INTEGRATED CIRCUIT

(75) Inventors: James P. Baukus, Westlake Village, CA (US); William M. Clark, Jr., Thousand Oaks, CA (US); Lap-Wai Chow, Monterey Park, CA (US); Allan R. Kramer, Simi Valley, CA (US)

(73) Assignee: Hughes Electronics Corporation, El Segundo, CA (US)

( * ) Notice: Subject to any disclaimer, the term of this patent is extended or adjusted under 35 U.S.C. 154(b) by 51 days.

(21) Appl. No.: 09/607,009

(22) Filed: Jun. 29, 2000

Related U.S. Application Data

(62) Division of application No. 09/087,748, filed on May 29, 1998, now Pat. No. 6,294,816, which is a division of application No. 08/191,063, filed on Feb. 3, 1994, now Pat. No. 5,866,933, which is a continuation of application No. 07/923,411, filed on Jul. 31, 1992, now abandoned.

(51) Int. Cl.$^7$ .................... H01L 21/44; H01L 21/425
(52) U.S. Cl. .................. 438/598; 438/514; 438/599; 257/390
(58) Field of Search .................. 438/922, 200, 438/217, 215, 467, 514, 584, 597, 599, 598, 934; 251/922, 910, 924, 368, 369; 257/390

(56) References Cited

U.S. PATENT DOCUMENTS

| 3,946,426 A | 3/1976 | Sanders ............... 357/71 |
| 4,101,344 A | 7/1978 | Kooi et al. |
| 4,139,864 A | 2/1979 | Schulman et al. ........ 358/188 |

(List continued on next page.)

FOREIGN PATENT DOCUMENTS

| EP | 0528 302 A1 | 2/1993 | |
| FR | 2486717 | 1/1982 | |
| FR | 2486.717 | 1/1982 | |
| GB | 2 059 156 | 4/1981 | |
| JP | 56-101689 | 8/1981 | |
| JP | 58-190064 | 11/1983 | |
| JP | 59008352 | 1/1984 | |
| JP | 62-130538 | 6/1987 | |
| JP | 63-129647 | 6/1988 | |
| JP | 2-46762 | 2/1990 | |
| JP | 02237038 | 9/1990 | ........... H01L/27/02 |
| JP | 2-290043 | 11/1990 | |
| JP | 05275529 | 10/1993 | |
| JP | 05304207 | 11/1993 | |
| JP | 63129647 | 6/1998 | ........... H01L/21/88 |
| WO | WO92/02042 | 2/1992 | |

OTHER PUBLICATIONS

U.S. patent application Ser. No. 07/278,889, Crafts, filed Dec. 2, 1988.
Sze, "Physics of Semiconductor Devices", 2d Edition, John Wiley & Sons, 1981, pp. 433.
Patent Abstracts of Japan vol. 016, No. 197 (p–1350) May 12, 1992 & JP–A–40 28 092 (Toshiba Corp), abstract.
Lee, "Engineering a Device for Electron–beam Probing", *IEEE Design and Test of Computers*, 1989, pp. 36–49.
Frederiksen, *Intuitive CMOS Electronics*, McGraw–Hill Publishing Co., 1989, pp. 134–145.

*Primary Examiner*—Olik Chaudhuri
*Assistant Examiner*—Brook Kebede
(74) *Attorney, Agent, or Firm*—V. D. Duraiswamy; M. W. Sales

(57) ABSTRACT

An integrated circuit is protected from reverse engineering by connecting doped circuit elements of like conductivity with a doped implant in the substrate, rather than with a metallized interconnect. The doped circuit elements and their corresponding implant interconnections can be formed in a common fabrication step with common implant masks, such that they have an integral structure with similar dopant concentrations. The metallization above the substrate surface can be designed to provide further masking of the interconnects, and microbridges can be added to span strips of transistor gate material in the interconnect path.

11 Claims, 4 Drawing Sheets

U.S. PATENT DOCUMENTS

| | | |
|---|---|---|
| 4,164,461 A | 8/1979 | Schilling ............... 204/192 EC |
| 4,267,578 A | 5/1981 | Vetter et al. ................. 364/709 |
| 4,291,391 A | 9/1981 | Chatterjee et al. .......... 365/184 |
| 4,295,897 A | 10/1981 | Tubbs et al. |
| 4,314,268 A | 2/1982 | Yoshioka et al. ............. 357/48 |
| 4,317,273 A | 3/1982 | Guterman et al. |
| 4,343,079 A | 8/1982 | Jochems |
| 4,374,454 A | 2/1983 | Jochems |
| 4,435,895 A | 3/1984 | Parillo |
| 4,471,376 A | 9/1984 | Morcom et al. .............. 357/71 |
| 4,581,628 A | 4/1986 | Miyauchi et al. ............. 357/71 |
| 4,583,011 A | 4/1986 | Pechar et al. ................ 307/440 |
| 4,603,381 A | 7/1986 | Guttag et al. ................ 364/200 |
| 4,623,255 A | 11/1986 | Suszko ........................ 356/389 |
| 4,727,493 A | 2/1988 | Taylor, Sr. ................... 364/490 |
| 4,766,516 A | 8/1988 | Ozdemir et al. ............ 361/380 |
| 4,799,096 A | 1/1989 | Koeppe ........................ 357/42 |
| 4,821,085 A | 4/1989 | Haken et al. ................. 357/67 |
| 4,830,974 A | 5/1989 | Chang et al. |
| 4,975,756 A | 12/1990 | Haken et al. ................. 357/4.1 |
| 5,030,796 A | 7/1991 | Swanson et al. ........... 174/52.2 |
| 5,050,123 A | 9/1991 | Castro .......................... 365/53 |
| 5,061,978 A | 10/1991 | Mizutani et al. .............. 357/30 |
| 5,065,208 A | 11/1991 | Shah et al. .................... 357/34 |
| 5,068,697 A | 11/1991 | Noda et al. ................. 357/23.5 |
| 5,070,378 A | 12/1991 | Yamagata .................. 357/23.5 |
| 5,101,121 A | 3/1992 | Sourgen ...................... 307/465 |
| 5,117,276 A | 5/1992 | Thomas et al. ............... 357/71 |
| 5,132,571 A | 7/1992 | McCollum et al. ....... 307/465.1 |
| 5,138,197 A | 8/1992 | Kuwana ...................... 307/449 |
| 5,146,117 A | 9/1992 | Larson ........................ 307/465 |
| 5,168,340 A | 12/1992 | Nishimura |
| 5,202,591 A | 4/1993 | Walden ........................ 307/450 |
| 5,227,649 A | 7/1993 | Chapman ..................... 257/204 |
| 5,231,299 A | 7/1993 | Ning et al. .................. 257/316 |
| 5,302,539 A | 4/1994 | Haken et al. .................. 437/41 |
| 5,308,682 A | 5/1994 | Morikawa |
| 5,309,015 A | 5/1994 | Kuwata et al. .............. 257/659 |
| 5,336,624 A | 8/1994 | Walden ......................... 437/29 |
| 5,341,013 A | 8/1994 | Koyanagi |
| 5,354,704 A | 10/1994 | Yang et al. .................... 437/52 |
| 5,369,299 A | 11/1994 | Byrne .......................... 257/638 |
| 5,371,390 A | 12/1994 | Mohsen |
| 5,376,577 A | 12/1994 | Roberts et al. ................ 437/52 |
| 5,384,472 A | 1/1995 | Yin |
| 5,399,441 A | 3/1995 | Bearinger et al. ........... 428/689 |
| 5,441,902 A | 8/1995 | Hsieh et al. ................... 437/34 |
| 5,468,990 A | 11/1995 | Daum ......................... 251/639 |
| 5,475,251 A | 12/1995 | Kuo et al. .................... 287/316 |
| 5,539,224 A | 7/1996 | Ema ........................... 257/211 |
| 5,721,150 A | 2/1998 | Pasch |
| 5,783,846 A | 7/1998 | Baukus et al. |
| 5,866,933 A | 2/1999 | Baukus et al. |
| 5,930,663 A | 7/1999 | Baukus et al. |
| 5,973,375 A | 10/1999 | Baukus et al. |
| 6,064,110 A | 5/2000 | Baukus et al. |
| 6,294,816 B1 | 9/2001 | Baukus et al. |

PROCESS FOR FABRICATING SECURE INTEGRATED CIRCUIT

This is a division of application Ser. No. 09/087,748 now U.S. Pat. No. 6,294,816 filed May 29, 1998 which was a divisional of Serial No. 08/191,063 filed Feb. 3, 1994, now U.S. Pat. No. 5,866,933 which was a continuation of the parent application Serial No. 07/923,411 filed Jul. 31, 1992. Now abandoned.

BACKGROUND OF THE INVENTION

1. Field of the Invention

This invention relates to the prevention of reverse engineering of integrated circuits (ICs), and more particularly to security techniques in which interconnections between circuit elements are made undetectable.

2. Description of the Related Art

Several techniques have been used to reverse engineer ICs. Electron (e)-beam probing with a scanning electron microscope (SEM), either through SEM photographs or voltage contrast analysis, is the standard reverse engineering mechanism, although secondary ion mass spectrometry (SIMS), spreading resistance analysis and various other techniques have also been used. A general description of e-beam probing is provided in Lee, "Engineering a Device for Electron-beam Probing", *IEEE Design & Test of Computers*, 1989, pages 36–49.

Numerous ways to frustrate unwanted attempts to reverse engineer an IC have also been developed. For example, in U.S. Pat. No. 4,766,516 to Ozdemir et al. (assigned to Hughes Aircraft Company, the assignee of the present invention), additional circuit elements that do not contribute toward the desired circuit function are added to an IC, and disguised with the visible appearance of being an ordinary part of the IC. The elements have physical modifications that are not readily visible but cause them to function in a different manner, inhibiting the proper functioning of the IC in case of an attempted copying or other unauthorized use. When the apparent function rather than the actual function of the disguised elements are copied, the resulting circuit will not operate properly.

In U.S. Pat. No. 4,583,011 to Pechar a pseudo-MOS (metal oxide semiconductor) device is given a depletion implant that is not readily visible to a copier, who would infer from the device's location in the circuit that it would be enhancement-mode. A somewhat related approach is taken in French patent publication no. 2 486 717 by Bassett et al., published Jan. 15, 1982; the circuit doping is controlled so that some devices which appear to be transistors actually function as either open or short circuits. And in U.S. Pat. No. 4,603,381 to Guttag the memory of a central processing unit is programmed by the doping of its channel regions, rather than by the presence or absence of gates, to protect permanently programmed software.

Instead of disguising circuit elements, some systems have a mechanism to protect the circuit from operating until a correct access code has been entered. Such systems are described in U.S. Pat. No. 4,139,864 to Schulman and U.S. Pat. No. 4,267,578 to Vetter.

Each of the above protection schemes requires additional processing and/or uses additional circuitry that is dedicated to security and does not contribute to the basic functioning of the circuit. This increases the cost of circuit production and complicates the circuitry.

SUMMARY OF THE INVENTION

The present invention seeks to provide a security system and method to protect against IC reverse engineering that is very difficult to detect, can be implemented without any additional fabrication steps and is compatible with computer added design (CAD) systems that allow many different kinds of logic circuits to be constructed with ease.

A logic gate is formed in a semiconductor substrate in accordance with the invention by forming doped regions in the substrate of like conductivity, and interconnecting at least some of the like conductivity regions by similarly doping interconnect portions of the substrate that run between such regions. The interconnects and the regions they connect are preferably doped simultaneously through a common dopant implantation mask to similar dopant concentrations, resulting in an integral structure for the doped regions and their interconnects. Metallized interconnects are provided as needed between p– and n– doped regions, and metallic microbridges can be used to span strips of poly-crystalline gate material that interrupt an interconnect circuit. A metallized interconnect can also be formed above the substrate to further mask a doped interconnect from observation.

Although doped implants are generally not as highly conductive as metallized interconnects, their resistance is low enough to serve an interconnect function at very large scale integration (VLSI) dimensions. Because the implanted connections are not visible to SEM or optical viewing technique, the purpose or function of the logic gates cannot be deduced, thus making the circuit very difficult to reverse engineer. Many different circuit designs that use the security technique can be stored in a CAD library and readily recalled for use as desired.

Further features and advantages of the invention will be apparent to those skilled in the art from the following detailed description, taken together with the accompanying drawings.

DETAILED DESCRIPTION OF THE INVENTION

An important aspect of this invention is that it does not rely upon any modifications or additions to the functioning of the circuitry that is to be protected from reverse engineering, nor does it require any additional processing steps or equipment. Instead, a highly effective deterrent to reverse engineering is accomplished in a streamlined manner that adds neither cost, time nor complexity to the basic circuitry.

Implementations of the invention in the form of NAND and NOR gates will first be described. Using such gates as building blocks, many different types of logic circuitry can be designed. A distinct advantage of the invention is that different types of logic circuits may be made to look alike, thus confusing a potential reverse engineer.

Figure 1A:
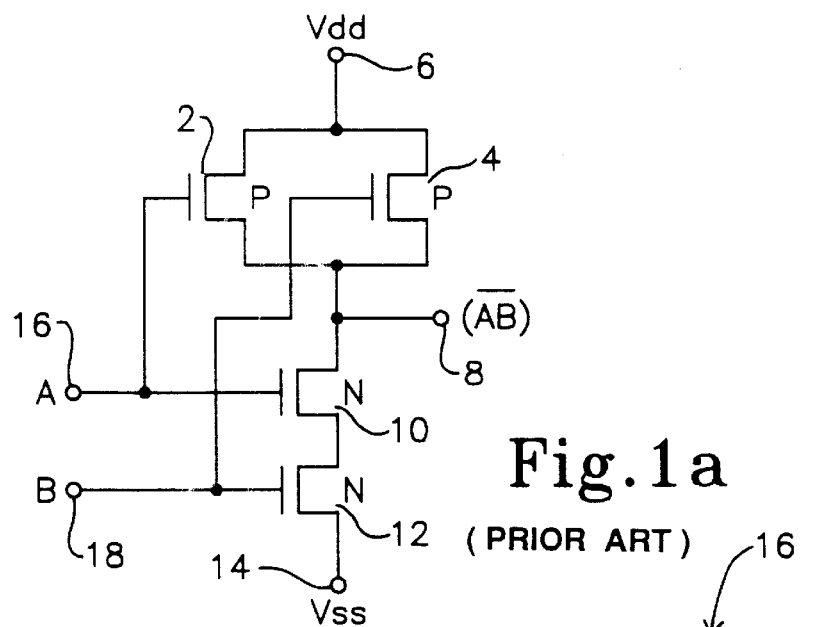
FIG. 1a is a schematic diagram of a conventional NAND gate.

FIG. 1a is a schematic diagram of a conventional two-input NAND gate circuit, with a pair of p-channel transistors 2, 4 connected in parallel between a positive voltage. terminal 6 and an output terminal 8, and a pair of n-channel transistors 10, 12 connected in series between a negative voltage terminal 14 and the output terminal 8. Input terminals 16 and 18 for the inputs designated A and B are connected to respective p-channel/n-channel transistor pairs.

Figure 1B:
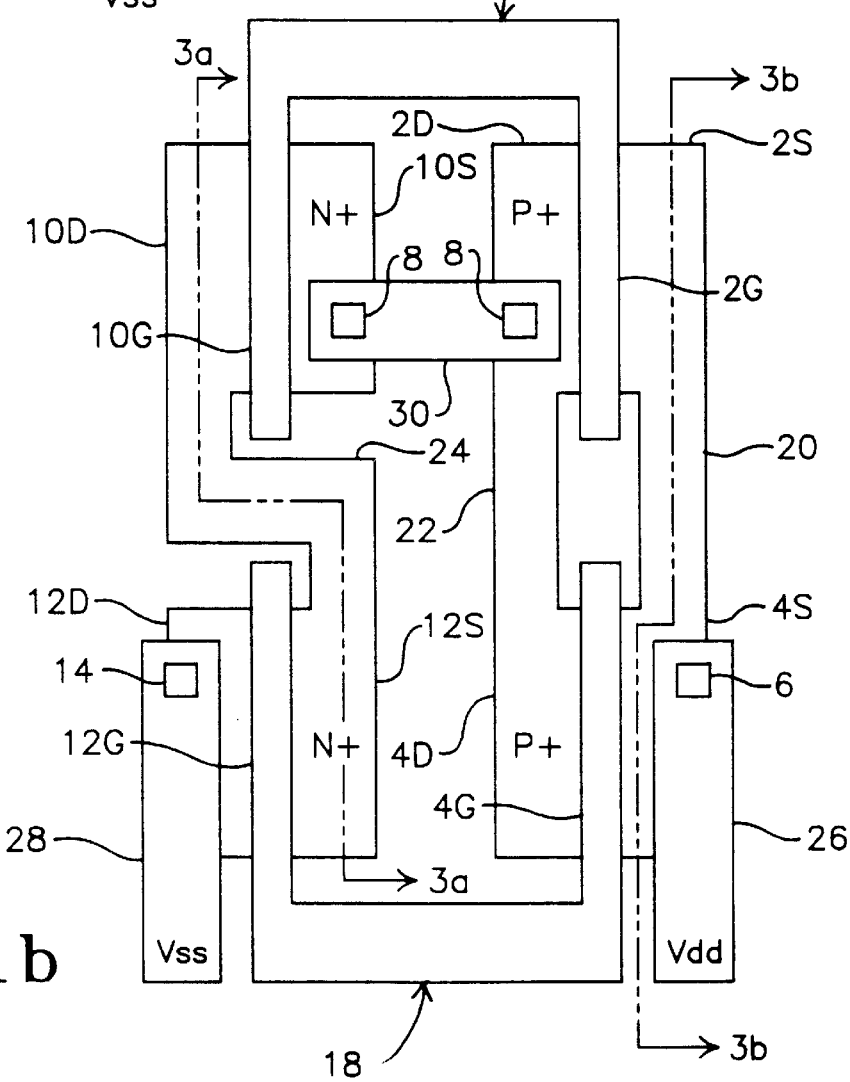
FIG. 1b is a plan view of a NAND gate in accordance with the invetion.

An implementation of this basic logic gate in accordance with the invention is shown in FIG. 1b. The sources, drains and gates of each of the transistors are indicated by the same transistor numbers as in FIG. 1, followed by S, D or G, respectively. The transistor sources and drains (the designation of an element as a source or drain is somewhat arbitrary) are fabricated in a conventional manner by implanting dopant ions into the circuit substrate. The p+ sources and drains of the p-channel devices 2 and 4 are typically doped with a boron ion implant at a density of about $4 \times 10^{15}$ ion/cm$^2$, and an implantation energy of about 30 keV. The n+ source and drain regions of the n-channel transistors 10 and 12 are typically doped in accordance with industry standards with arsenic ions at a density of about $5 \times 10^{15}$/cm$^2$, and an implant energy of about 150 keV. Either a masked ion flood beam or a focused ion beam may be used; doping by older gaseous diffusion techniques may also be employed.

Rather than connecting the transistor regions of like conductivity with metallized interconnects in the conventional fashion, such connections are made by means of doping implants into the substrate between the desired sources and drains. Three such interconnections 20, 22 and 24 are shown between sources 2S and 4S, drains 2D and 4D and drain 10D-source 12S, respectively. The implant interconnections are preferably established simultaneously with the source and drain implants by providing appropriate openings in the implantation mask (if flood beam implantation is employed), or by extending the scanning area of a focused ion beam. As an alternate to implantation a conventional gaseous diffusion process could be employed to establish the doping, but this is less preferable than implantation. By using the same source/drain fabrication step to also fabricate the implanted interconnections, the interconnections have the same dopant concentration as the sources and drains and are formed integrally therewith.

The remainder of the gate circuit is fabricated in a conventional manner. The polysilicon gates (assuming a silicon substrate is used) can be formed either before or after the source and drain and interconnect implants, while metallized connectors 26, 28 and 30 are run over intervening insulating layers to provide external connections to the Vdd terminal 6, Vss terminal 14 and output terminal 8.

Figure 2A:
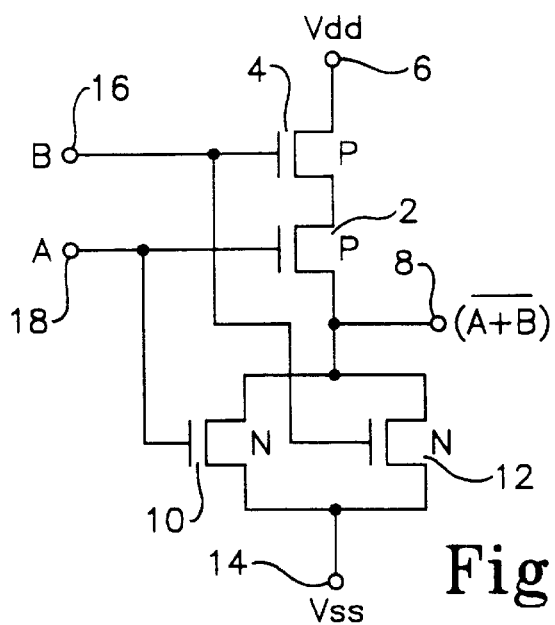
FIG. 2a is a schematic diagram of a conventional NOR gate.
Figure 2B:
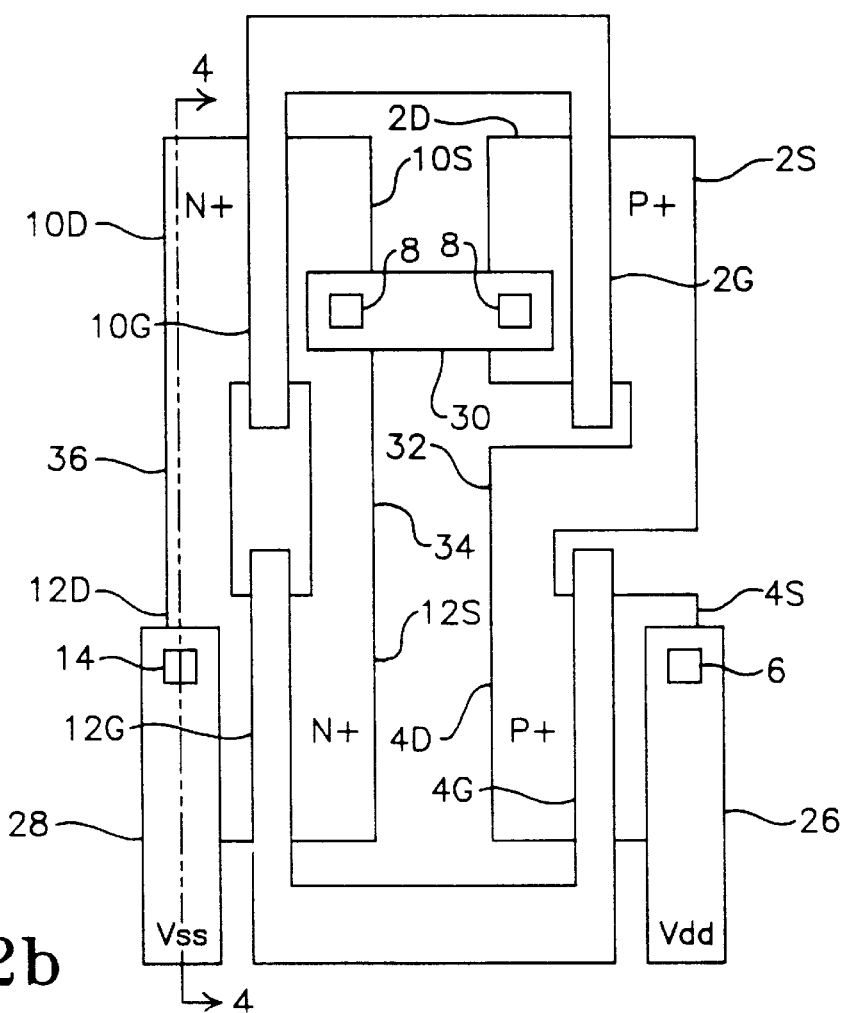
FIG. 2b is a plan view of a NOR gate in accordance with the invention.

FIG. 2a is a schematic diagram of a conventional NOR gate, while FIG. 2b illustrates its implementation in ac-cordance with the invention. It uses the same transistor layout as the NAND gate of FIGS. 1a and 1b, but the im-planted interconnects between the transistors of like conductivity is reversed. Specifically, p-channel transistors 2 and 4 are connected in series between positive voltage terminal 6 and output terminal 8 by a p-doped implant 32 that runs between drain 4D of transistor 4 and source 2S of transistor 2; the n-channel transistors 10 and 12 are connected in parallel between negative voltage terminal 14 and output terminal 8 by n-doped implant interconnects 34 and 36 between the sources and gates of transistors 10 and 12, respectively.

Figure 3A:
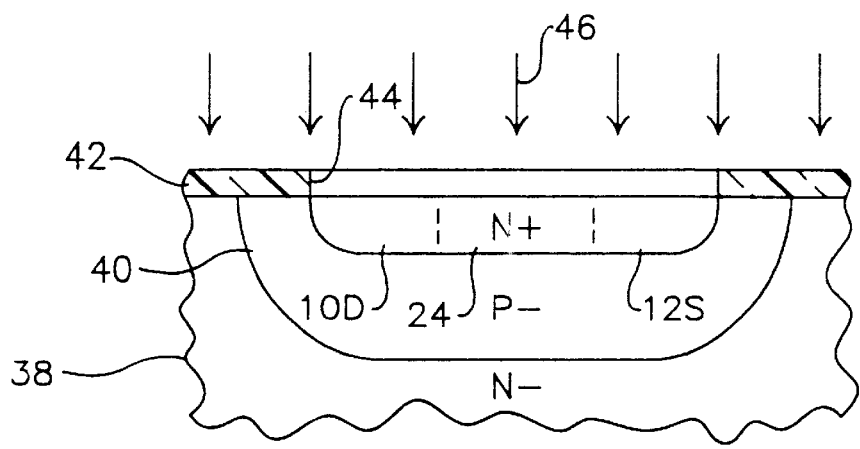
FIGS. 3a and 3b are sectional views taken along section lines 3a—3a and 3b—3b of FIG. 1b that illustrate the simultaneous formation of transistor source/drain regions and implanted interconnects therebetween with a common implant process and common masks for n-channel and p-channel transistors, respectively.
Figure 3B:
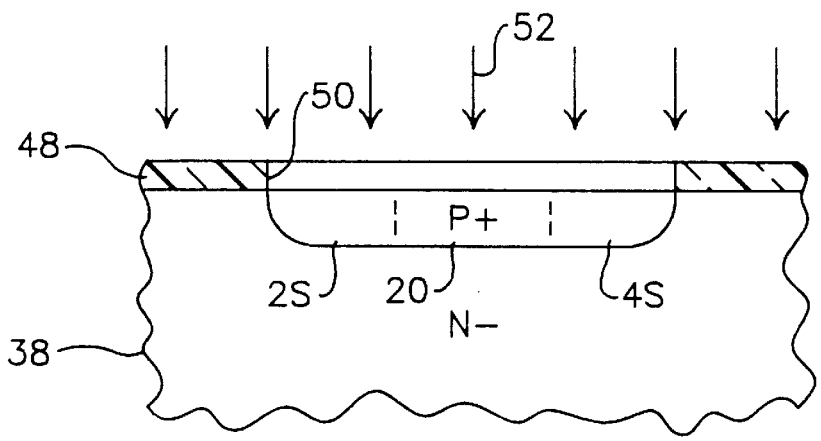

FIGS. 3a and 3b are sectional views taken along the section lines 3a—3a and 3b—3b of FIG. 1b, respectively, illustrating the fabrication of the source, drain and interconnection implants, but excluding the polysilicon and metallization layers. The devices are formed in a semiconductor substrate 38 that for illustrative purposes is silicon, but may also be GaAs or some other desired semiconductor material. The circuit fabrication can be accomplished with a conventional process, such as that described in Frederiksen, *Intuitive CMOS Electronics*, McGraw-Hill Publishing Co., 1989, pages 134–145; it is a distinct advantage of the invention that it does not require any special processing to implement.

In a typical CMOS process, a protective oxide layer about 250 Angstroms thick is first laid down over the semiconductor substrate 38. A well is then implanted through openings in the oxide layer for each FET whose source and drain is of the same conductivity type as the substrate doping. With substrate 38 illustrated as having an n− doping, a somewhat more heavily doped p-well 40 would be implanted about 3 microns deep for the n-channel devices (FIG. 3a). The wells are then subjected to a long, high temperature anneal, typically at about 1,1500° C. for about 10 hours.

The next step is the FET source and drain implants. For the n-channel devices an oxide mask 42 is laid down over the substrate with openings at the desired locations for the sources and drains of the n-channel devices. In the case of two n-channel FETs 10 and 12 that are to be interconnected by means of a ion implantation in accordance with the invention, a single continuous mask opening 44 is provided for the drain 10D of FET 10, the source 12S of FET 12, and the interconnection implant 24 that runs between them. The implantation is then formed, preferably with a flood beam indicated by numeral 46, of suitable n-dopant ions such as arsenic.

As in conventional processing, a separate implant mask 48 is provided for the p-channel devices (FIG. 3b). A single continuous opening 50 is provided in the mask for each interconnection implant and the transistor elements which they connect; these are illustrated as p-channel FET sources 2S and 4S and interconnect implant 20. Implantation is preferably performed with a flood beam, indicated by numeral 52, of a suitable p-type dopant such as boron.

The implantation can be performed exactly the same as in prior unsecured processes, the only difference being that the implant is now done through a larger opening in each mask that includes the implanted interconnection as well as the FET sources and drains. No differences in processing time or techniques are required, and the operator need not even know that the mask provides for circuit security. The circuits are then completed in a conventional manner, with threshold implants made into the FET channels to set the transistor characteristics. A field oxide is laid down as usual, but it also defines active areas which encompass"actual" as well as"possible" interconnect regions. Otherwise, the interconnect paths would be apparent. Polysilicon is then deposited and doped either by diffusion or ion implantation to form the channels and the interconnects. A dielectric is then deposited and metallization layers added to establish inputs, outputs and bias signals. Finally an overglass coating is laid down over the entire chip.

Figure 4:
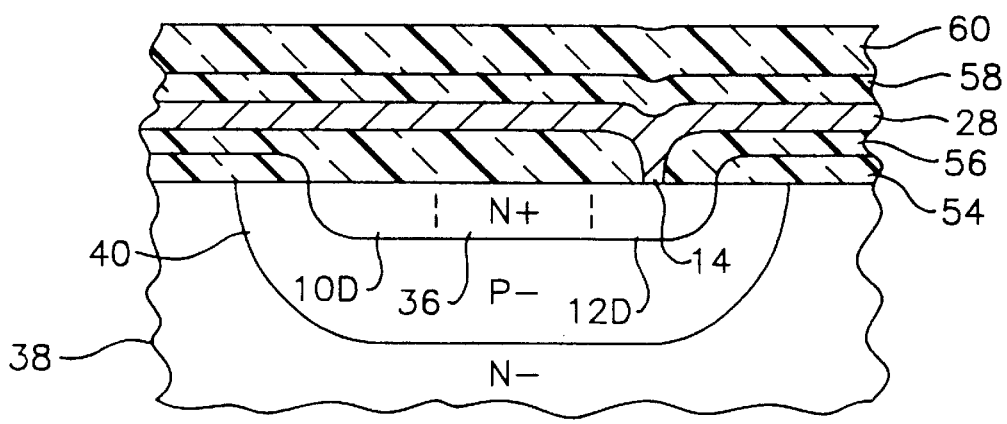
FIG. 4 is a sectional view taken along section line 4—4 in FIG. 2b of interconnected source/drain regions in accordance with the invention, with the implanted interconnect. shaded by an upper metallization layer.

The implant interconnections have been demonstrated to be virtually invisible to SEM scanning in a secondary electron mode. They are also believed to be invisible to a voltage contrast SEM analysis. However, to guard against the possibility of their being detected through voltage contrast, the upper metallization can be designed to mask the implants. Thus, voltage contrast analysis of the interconnect implantations cannot be performed until the upper metallization layers are stripped away to expose the implants, but if the upper metallization is removed the voltage contrast analysis cannot be performed because there is no longer a mechanism for applying a voltage to the implant; the metallization that must be removed to expose the implants provided this function. Such a structure is illustrated in FIG. 4, which shows a sectional view of FET drains 10D and 12D and their interconnect implant 36 from. FIG. 2b, after the circuit fabrication has been completed. The structure employs a p-well process; a corresponding structure would result from an n-well process. A field oxide layer 54 insulates the FETs from adjacent devices, while the contact 14 to FET drain 12D is made from metalization layer 28 through an opening in an oxide insulating layer 56. Several metallization layers separated by oxide layers are normally provided, although for simplicity only one metallization layer 28 is illustrated. This layer 28 is topped by a final oxide layer 58, and then a thicker overglass coating 60 of $SiO_2$ that extends over the entire chip and is lightly doped so as to prevent the buildup of a static charge.

While the implanted interconnections described thus far can successfully connect different FETs, having them pass under strips of polysilicon that extend along the substrate surface should be avoided. This is because the polysilicon is biased to function as a gate, and when crossing over an implanted interconnection would in effect establish a transistor at that location. To avoid this, metal microbridges can be used to span polysilicon strips. Microbridges are known elements that are described, for example, in U.S. Pat. Nos. 4,239,312 and 4,275,410, assigned to Hughes Aircraft Company.

Figure 5:
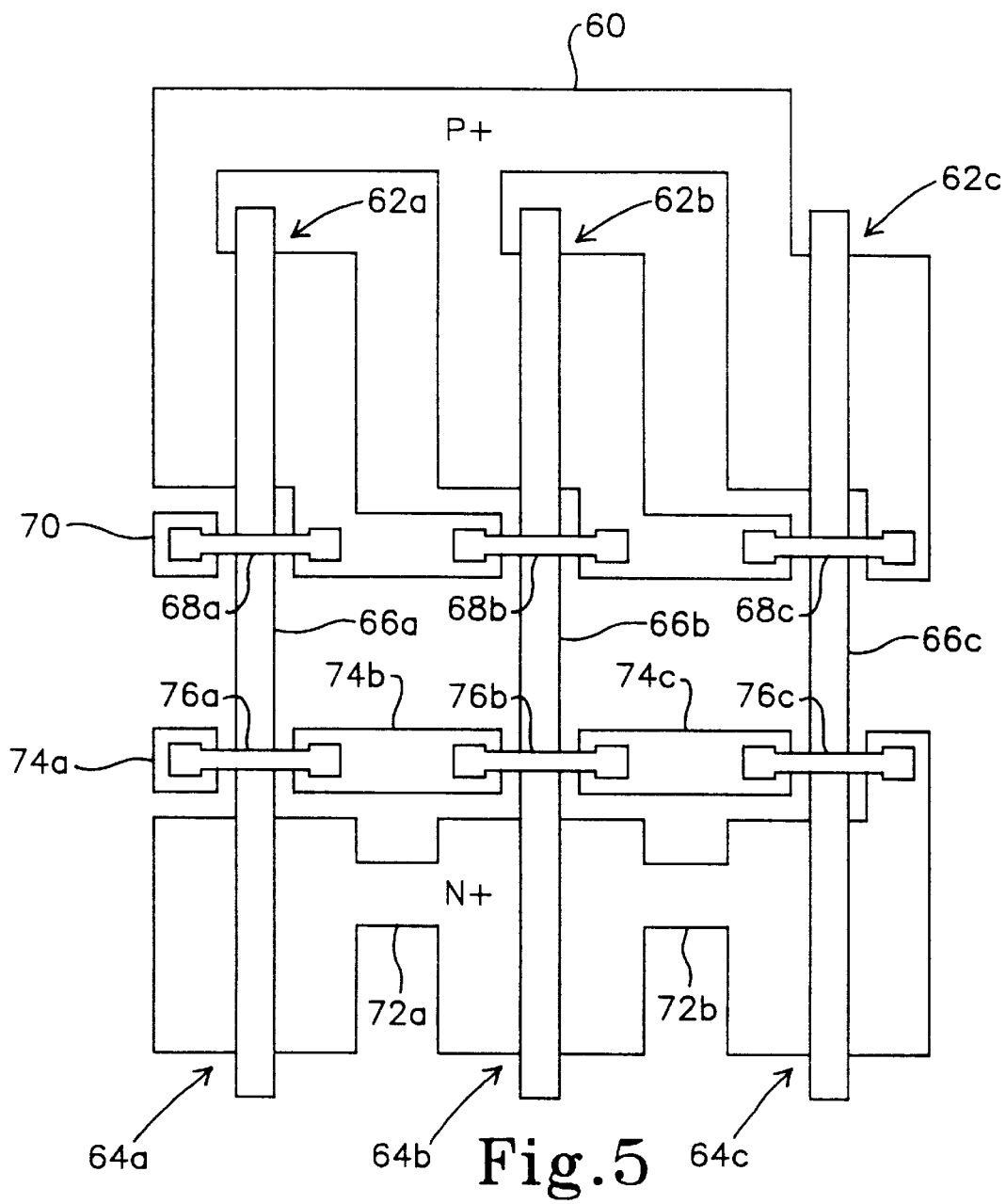
FIG. 5 is a simplified plan view of a logic gate that. uses metallized micarbridges to span polycrystalline gate layers in accordance with the invention.

FIG. 5 illustrates a three-input NAND gate that uses this approach; metallized connectors that are added at a later stage in the fabrication are not shown. The gate includes three p-channel FETs 62a, 62b and 62c, and three n-channel FETs 64a, 64b and 64c. Common polysilicon gate strips 66a, 66b and 66c are provided for transistor pairs 62a, 64a; 62b, 64b; and 62c, 64c, respectively. The polysilicon strips extend over the substrate surface between their respective FETS, as well as over the FET channels. To connect the upper FETs 62a–62c in parallel, their drains are electrically tied together by an interconnecting implant 68 in accordance with the invention. However, a corresponding interconnection cannot be made between their sources, since it would have to cross the polysilicon gate strip 66b and 66c. To overcome this, the FET sources are extended by implant interconnects to locations adjacent to the polysilicon strips 66b and 66c, and these extensions are then interconnected by means of microbridges 68b and 68c that span strips 66b and 66c, respectively. An additional microbridge 68a is shown spanning polysilicon strip 66a between the FET 62a source extension and an island 70 that is implanted into the substrate along with the FET sources, drains and interconnects. This bridge can either serve a dummy purpose to confuse a reverse engineer, or island 70 can provide a contact point to receive a signal from an upper metallization for transmission to the sources of FETs 62a–62c.

The lower FETs 64a–64c can be connected in series directly with implanted interconnects 72a and 72b between the source of FET 64a and the drain of FET 64b, and the source of 64b and drain of 64c, since there are no polysilicon strips in the paths of these connections. However, an implanted source extension of FET 64c is shown connected to an implant island 74a above the drain of FET 64a via a series of implanted islands 74b and 74c and microbridges 76a, 76b and 76c that span polysilicon strips 64a, 64b and 64c, respectively. These microbridges can also either serve a dummy purpose, or be used to transmit a signal between a metallized connection to island 74a and the drain of FET 64c.

Figure 6:
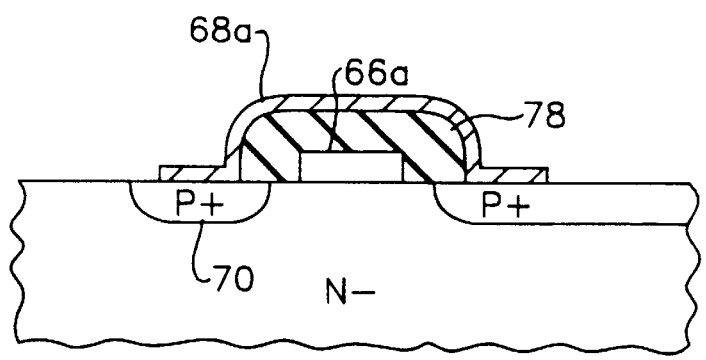
FIG. 6 is a sectional view of a microbridge span.

FIG. 6 is a simplified sectional view of microbridge 68a and its interconnection with the circuitry. One leg of the microbridge contacts the upper surface of p-doped implant island 70, while the opposite leg contacts the p-doped implant interconnection between FETs 62a and 62b. The center portion of the microbridge spans the polysilicon strip 66a, with an insulating dielectric 78 between the two elements.

By replacing metal interconnects with implanted interconnections that are not visible to SEM or optical viewing techniques, the purpose or function of the protected circuits cannot be deduced by a reverse engineer. Furthermore, it will be difficult for the reverse engineer to determine when the circuits are covertly connected by etching all metal, oxide and nitride layers deposited later in the fabrication process, because with the dimensions employed for modern VLSI circuits normal dying, ion milling, ion spectroscopy and SIMS techniques do not have the required sensitivity.

The secure NAND and NOR gates described herein and other types of logic gates can form the building blocks for many complicated logic sequences, which would therefore be virtually impossible to reverse engineer. Although a spreading resistance reverse engineering analysis might still theoretically be possible, with a small probe measuring the circuit's resistivity over a very small volume and stepped progressively across the surface, in practice this would also not work. The upper layers would have to be stripped away to analyze the implanted interconnects with the spreading resistance technique, but in so doing the positional registration of the implanted areas with respect to the stripped metallization would be lost. Furthermore, spreading resistance analysis is a mechanical process that is much slower than SEM analysis. The reverse engineer would still be able to see the transistors, but not the connections between them.

Since the only required change in the fabrication process is for a modification in the openings of the ion implantation masks, a new set of standard masks with the modified openings could be provided and used as standard elements of the circuit design process. This makes the invention particular suitable to CAD systems, with the designer simply selecting a desired secured logic gate design from a library of such gates.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A method of fabricating integrated circuit (IC) logic circuitry, comprising:

forming a plurality of IC transistor logic circuits in a semiconductor substrate (38), each of said logic circuits having substantially the same transistor layout and each including respective pluralities of doped transistor regions that have like conductivities, and within each of said logic circuits, interconnecting at least some of the logic circuit's transistor regions with doped interconnects that are formed in said substrate and have the same doping conductivity as the regions thereby interconnected, with the interconnects for at least one of said logic circuits connecting transistor regions of said transistor layout that are different from the transistor regions connected by the interconnects for at least one other of said logic circuits, thereby providing different logic functions for their respective logic circuits.

2. The method of claim 1, wherein said interconnects are doped to a similar dopant concentration as the dopant concentrations of the transistor regions thereby interconnected.

3. The method of claims 1, wherein said interconnects are formed integrally with the doped transistor regions there-by interconnected.

4. The method of claim 1, wherein said interconnects and the transistor regions thereby interconnected are doped simultaneously.

5. The method of claim 4, wherein said interconnects and the transistor regions thereby interconnected are doped through a common dopant mask.

6. A method of fabricating a secure integrated circuit logic chip, comprising:

providing a semiconductor substrate;

forming a plurality of transistor logic circuits with doped transistor regions that have a like conductivity and substantially the same tranletor layout by introducing dopant ions into said substrate; and establishing interconnections in said logic circuits by introducing dopants into said substrate between at least two of said transistor regions that have a like conductivity, substantially simultaneously with said step of introducing dopant ions into said substrate to form said doped transistor regions, with the interconnections for at least some of said logic circuits differing from each other to provide different logic functions for their respective logic circuits.

7. The method of claim 6, wherein said steps of forming circuit elements and establishing interconnnections use an implantation mask with a single continuous mask opening.

8. The method of claim 6, wherein said steps of forming and establishing are performed by implantation.

9. The method of claim 6, wherein said steps of forming and establishing are performed by gaseous diffusion.

10. A method of fabricating a secure device having at least two logic circuits with respective interconnected FETs, each of said FETs having a source and a drain, said method comprising:

providing a doped semiconductor substrate;

laying down a field oxide on said FETs defining active areas;

depositing a protective oxide layer over said semiconductor substrate;

forming a well by introducing dopant ions through openings in said protective oxide layer for each FET whose source and drain are of same conductivity type as said substrate doping;

annealing said well at a high temperature; and introducing dopant ions, using respective single continuous mask openings in an implantation mask, to form sources and drains for said FETs and conductive interconnections between them, with said logic circuits having substantially the same transistor layout, and the interconnections for at least some of said logic circuits differing from each other to provide different logic functions for their respective logic circuits.

11. A method of fabricating a secure device having at least two interconnected FETs, each of said FETs having a source and a drain, said method comprising:

providing a doped semiconductor substrate;

laying down a field oxide on said FETs defining active areas;

depositing A protective oxide layer over said semiconductor substrate;

forming a well by introducing dopant ions through openings in said protective oxide layer for each FET whose source and drain are of same conductivity type as said substrate doping;

annealing said well at a high temperature;

introducing dopant ions, using a single continuous mask opening in an implantation mask, to form sources and drains for said FETs and interconnections;

depositing polysilicon over said substrate after said dopant ions are introduced;

doping said polysilicon to form channels and interconnects;

depositing a dielectric over said substrate after said polysilicon has been doped;

depositing metallization layers on said dielectric to establish inputs, outputs and bias signals, and to mask the interconnects; and applying an overglass coating.

* * * * *